(12) United States Patent
Lee et al.

(10) Patent No.: US 8,338,221 B2
(45) Date of Patent: Dec. 25, 2012

(54) METHOD FOR MANUFACTURING THIN FILM TYPE SOLAR CELL

(75) Inventors: Chang Ho Lee, Gyeonggi-do (KR); Hyung Dong Kang, Gyeonggi-do (KR); Hyun Ho Lee, Gyeonggi-do (KR); Yong Hyun Lee, Gyeonggi-do (KR); Seon Myung Kim, Gyeonggi-do (KR)

(73) Assignee: Jusung Engineering Co., Ltd., Gwangju-si, Gyeonggi-do (KR)

( * ) Notice: Subject to any disclaimer, the term of this patent is extended or adjusted under 35 U.S.C. 154(b) by 338 days.

(21) Appl. No.: 12/628,215

(22) Filed: Dec. 1, 2009

(65) Prior Publication Data

US 2010/0136736 A1 Jun. 3, 2010

(30) Foreign Application Priority Data

Dec. 1, 2008 (KR) .................. 10-2008-0120811

(51) Int. Cl.
*H01L 21/00* (2006.01)
*H01L 29/04* (2006.01)
*H01L 29/10* (2006.01)
*H01L 31/00* (2006.01)

(52) U.S. Cl. ............... 438/96; 438/57; 257/52; 257/53

(58) Field of Classification Search .................. None
See application file for complete search history.

(56) References Cited

U.S. PATENT DOCUMENTS

| 5,646,050 A * | 7/1997 | Li et al. ........................... 438/96 |
| 6,323,056 B1 * | 11/2001 | Miyoshi ........................ 438/80 |
| 2002/0117199 A1 * | 8/2002 | Oswald ........................ 136/256 |
| 2009/0104732 A1 * | 4/2009 | White .............................. 438/96 |

* cited by examiner

*Primary Examiner* — N Drew Richards
*Assistant Examiner* — Michael Jung
(74) *Attorney, Agent, or Firm* — Renaissance IP Law Group LLP (57) ABSTRACT

A method for manufacturing a thin film type solar cell is disclosed, which is capable of reducing degradation of solar cell by decreasing the number of dangling bonding sites or $SiH_2$ bonding sites existing in amorphous silicon owing to an optimal content ratio of ingredient gases, an optimal chamber pressure, or an optimal substrate temperature during a process for depositing an I-type semiconductor layer of amorphous silicon by a plasma CVD method, the method comprising forming a front electrode layer on a substrate; sequentially depositing P-type, I-type, and N-type semiconductor layers on the front electrode layer; and forming a rear electrode layer on the N-type semiconductor layer, wherein the process for forming the I-type semiconductor layer comprises forming an amorphous silicon layer by the plasma CVD method under such circumstances that at least one of the aforementioned conditions is satisfied, for example, a content ratio of silicon-containing gas to hydrogen-containing gas is within a range between 1:7 and 1:10; a chamber pressure is maintained at a range between 2.0 Torr and 2.4 Torr; and a substrate temperature is maintained at a range between 225° C. and 250° C.

3 Claims, 6 Drawing Sheets

METHOD FOR MANUFACTURING THIN FILM TYPE SOLAR CELL

CROSS REFERENCE TO RELATED APPLICATIONS

This application claims the benefit of the Korean Patent Application No. P2008-0120811, filed on Dec. 1, 2008, which is hereby incorporated by reference as if fully set forth herein.

BACKGROUND OF THE INVENTION

1. Field of the Invention

The present invention relates to a solar cell, and more particularly, to a thin film type solar cell.

2. Discussion of the Related Art

A solar cell with a property of semiconductor converts a light energy into an electric energy.

A structure and principle of the solar cell according to the related art will be briefly explained as follows. The solar cell is formed in a PN junction structure where a positive (P)-type semiconductor makes a junction with a negative (N)-type semiconductor. When solar ray is incident on the solar cell with the PN junction structure, holes (+) and electrons (−) are generated in the semiconductor owing to the energy of the solar ray. By an electric field generated in a PN junction area, the holes (+) are drifted toward the P-type semiconductor and the electrons (−) are drifted toward the N-type semiconductor, whereby an electric power is produced with an occurrence of electric potential.

The solar cell can be largely classified into a wafer type solar cell and a thin film type solar cell.

The wafer type solar cell uses a wafer made of a semiconductor material such as silicon. In the meantime, the thin film type solar cell is manufactured by forming a semiconductor in type of a thin film on a glass substrate.

With respect to efficiency, the wafer type solar cell is better than the thin film type solar cell. However, in the case of the wafer type solar cell, it is difficult to realize a small thickness due to difficulty in performance of the manufacturing process. In addition, the wafer type solar cell uses a high-priced semiconductor substrate, whereby its manufacturing cost is increased.

Even though the thin film type solar cell is inferior in efficiency to the wafer type solar cell, the thin film type solar cell has advantages such as realization of thin profile and use of low-priced material. Accordingly, the thin film type solar cell is suitable for a mass production.

The thin film type solar cell is manufactured by sequential steps of forming a front electrode on a substrate, forming a semiconductor layer on the front electrode, and forming a rear electrode on the semiconductor layer.

Hereinafter, a related art thin film type solar cell will be described with reference to the accompanying drawings.

Figure 1:
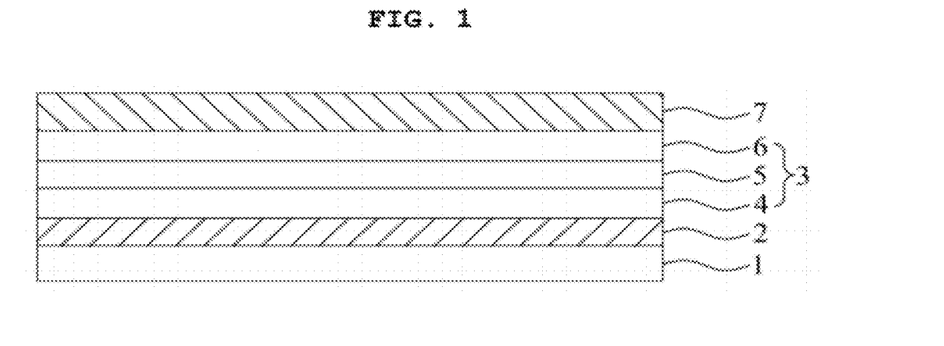
FIG. 1 is a cross section view illustrating a related art thin film type solar cell.

FIG. 1 is a cross section view illustrating a related art thin film type solar cell.

As shown in FIG. 1, the related art thin film type solar cell comprises a substrate 1; a front electrode layer 2 on the substrate 1; a semiconductor layer 3 on the front electrode layer 2; and a rear electrode layer 7 on the semiconductor layer 3.

The semiconductor layer 3 is formed in a PIN structure where a P (Positive)-type semiconductor layer 4, an I (Intrinsic)-type semiconductor layer 5, and an N(Negative)-type semiconductor layer 6 are deposited in sequence. The semiconductor layer 3 is generally formed of amorphous silicon.

However, the related art thin film type solar cell with the semiconductor layer 3 of the amorphous silicon is problematic in that cell efficiency is lowered due to the increase of degradation rate after the lapse of time. Among the factors leading to the increase of degradation rate is a plurality of dangling bonding sites or Si—$H_2$ bonding sites existing in the semiconductor layer 3. Under the currently-known processing conditions, it is difficult to deposit the amorphous silicon while decreasing the number of dangling bonding sites or Si—$H_2$ bonding sites. Thus, the increase of degradation rate is induced by the plurality of dangling bonding sites or Si—$H_2$ bonding sites existing in the deposited amorphous silicon.

In addition, a deposition rate of the amorphous silicon has to be increased for improvement of the yield. However, the increase of the deposition rate of the amorphous silicon may cause the increase of dangling bonding sites or Si—$H_2$ bonding sites existing in the deposited amorphous silicon. If RF power is applied more so as to increase the deposition rate of the amorphous silicon, the number of dangling bonding sites or Si—$H_2$ bonding sites existing in the deposited amorphous silicon is increased more. Accordingly, it is difficult to improve the yield due to the limits on the increase of the deposition rate of the amorphous silicon.

SUMMARY OF THE INVENTION

Accordingly, the present invention is directed to a method for manufacturing a thin film type solar cell that substantially obviates one or more problems due to limitations and disadvantages of the related art.

An object of the present invention is to provide a method for manufacturing a thin film type solar cell, which is capable of reducing degradation of solar cell by decreasing the number of dangling bonding sites or $SiH_2$ bonding sites existing in amorphous silicon.

Another object of the present invention is to provide a method for manufacturing a thin film type solar cell, which is capable of improving the yield and reducing degradation of solar cell by preventing dangling bonding sites or $SiH_2$ bonding sites from being increased in amorphous silicon, even though a deposition rate of amorphous silicon is increased.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for manufacturing a thin film type solar cell comprising forming a front electrode layer on a substrate; sequentially depositing P-type, I-type, and N-type semiconductor layers on the front electrode layer; and forming a rear electrode layer on the N-type semiconductor layer, wherein the process for forming the I-type semiconductor layer comprises forming an amorphous silicon layer by a plasma CVD method under such circumstances that a chamber pressure is maintained at a range between 2.0 Torr and 2.4 Torr, and a substrate temperature is maintained at a range between 225° C. and 250° C.

In another aspect of the present invention, a method for manufacturing a thin film type solar cell comprises forming a front electrode layer on a substrate; sequentially depositing P-type, I-type, and N-type semiconductor layers on the front electrode layer; and forming a rear electrode layer on the N-type semiconductor layer, wherein the process for forming the I-type semiconductor layer comprises forming an amorphous silicon layer by a plasma CVD method under such circumstances that a content ratio of silicon-containing gas to hydrogen-containing gas is within a range between 1:7 and 1:10, and a chamber pressure is maintained at a range between 2.0 Torr and 2.4 Torr.

In another aspect of the present invention, a method for manufacturing a thin film type solar cell comprises forming a front electrode layer on a substrate; sequentially depositing P-type, I-type, and N-type semiconductor layers on the front electrode layer; and forming a rear electrode layer on the N-type semiconductor layer, wherein the process for forming the I-type semiconductor layer comprises forming an amorphous silicon layer by a plasma CVD method under such circumstances that a content ratio of silicon-containing gas to hydrogen-containing gas is within a range between 1:7 and 1:10, and a substrate temperature is maintained at a range between 225° C. and 250° C.

In another aspect of the present invention, a method for manufacturing a thin film type solar cell comprises forming a front electrode layer on a substrate; sequentially depositing P-type, I-type, and N-type semiconductor layers on the front electrode layer; and forming a rear electrode layer on the N-type semiconductor layer, wherein the process for forming the I-type semiconductor layer comprises forming an amorphous silicon layer by a plasma CVD method under such circumstances that a content ratio of silicon-containing gas to hydrogen-containing gas is within a range between 1:7 and 1:10.

In another aspect of the present invention, a method for manufacturing a thin film type solar cell comprises forming a front electrode layer on a substrate; sequentially depositing P-type, I-type, and N-type semiconductor layers on the front electrode layer; and forming a rear electrode layer on the N-type semiconductor layer, wherein the process for forming the I-type semiconductor layer comprises forming an amorphous silicon layer by a plasma CVD method under such circumstances that a chamber pressure is maintained at a range between 2.0 Torr and 2.4 Torr.

In another aspect of the present invention, a method for manufacturing a thin film type solar cell comprises forming a front electrode layer on a substrate; sequentially depositing P-type, I-type, and N-type semiconductor layers on the front electrode layer; and forming a rear electrode layer on the N-type semiconductor layer, wherein the process for forming the I-type semiconductor layer comprises forming an amorphous silicon layer by a plasma CVD method under such circumstances that a substrate temperature is maintained at a range between 225° C. and 250° C.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 2(A to D) is a series of cross section views illustrating a method for manufacturing a thin film type solar cell according to one embodiment of the present invention;

FIGS. 8(A and B) are graphs illustrating variations of degradation rate according a deposition rate.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for manufacturing a thin film type solar cell according to the present invention will be described with reference to the accompanying drawings.

FIG. 2(A to D) is a series of cross section views illustrating a method for manufacturing a thin film type solar cell according to one embodiment of the present invention. FIG. 3 is a cross section view illustrating a plasma chemical vapor deposition apparatus (hereinafter, referred to as 'plasma CVD apparatus') according to one embodiment of the present invention.

Figure 2A:
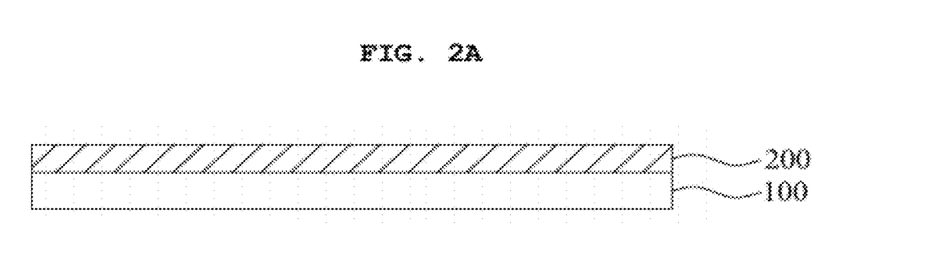
Figure 2B:
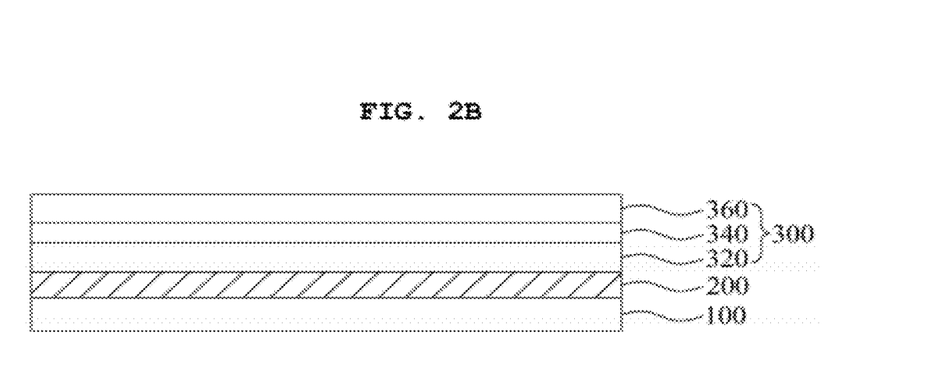
Figure 2C:
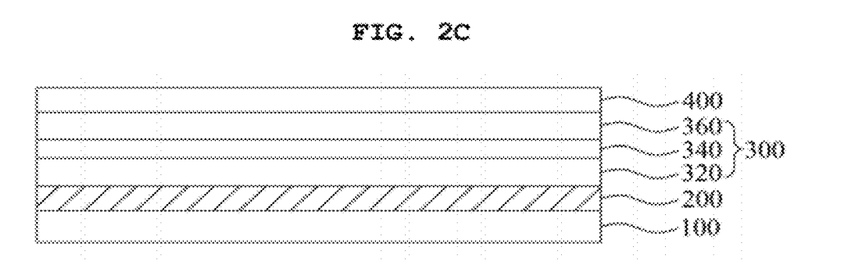
Figure 2D:
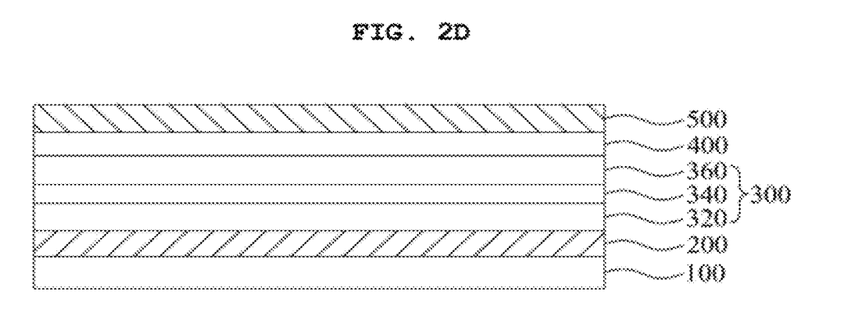
Figure 3:
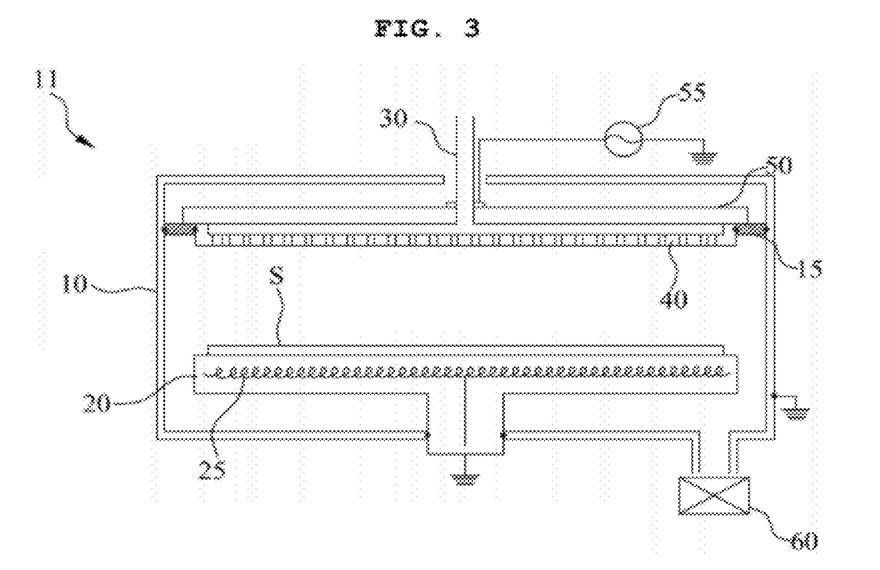
FIG. 3 is a cross section view illustrating a plasma chemical vapor deposition apparatus (plasma CVD apparatus) according to one embodiment of the present invention.

First, as shown in FIG. 2(A), a front electrode layer 200 is formed on a substrate 100.

The substrate 100 may be formed of glass or transparent plastic.

The front electrode layer 200 may be formed of a transparent conductive material such as ZnO, ZnO:B, ZnO:Al, ZnO:H, $SnO_2$, $SnO_2$:F, or ITO (Indium Tin Oxide) by a sputtering or MOCVD (Metal Organic Chemical Vapor Deposition) method.

In order to maximize absorption of solar ray, the front electrode layer 200 may have an uneven surface which is made by a texturing process. Through the texturing process, the surface of material layer is formed with the uneven surface, that is, texture structure, wherein the texturing process may be carried out by an etching process using photolithography, an anisotropic etching process using a chemical solution, or a groove-forming process using a mechanical scribing.

As shown in FIG. 2(B), a semiconductor layer 300 is formed on the front electrode layer 200. The semiconductor layer 300 is formed in a PIN structure where a P-type semiconductor layer 320, an I-type semiconductor layer 340, and an N-type semiconductor layer 360 are deposited in sequence.

A process for forming the semiconductor layer 300 with the PIN structure may comprise depositing an amorphous silicon layer by a plasma CVD method. This process may be carried out through the use of plasma CVD apparatus to be described with reference to FIG. 3.

As shown in FIG. 3, the plasma CVD apparatus 11 according to one embodiment of the present invention is provided with a chamber 10, a susceptor 20, a gas supply pipe 30, a gas distribution plate 40, an RF electrode 50, and a pressure adjustment pump 60.

The susceptor 20 is positioned inside the chamber 10, and the substrate (S) is placed on an upper surface of the susceptor 20. Also, the susceptor 20 has an electrothermal wire 25 therein. Thus, when power is supplied to the electrothermal wire 25 provided in the susceptor 20, the electrothermal wire 25 is heated so that a temperature of the substrate (S) is adjusted. Through the gas supply pipe 30, ingredient gases are supplied to the inside of the chamber 10. The gas distribution plate 40 sprays the ingredient gases supplied from the gas supply pipe 30 onto the upper surface of the susceptor 20. The RF electrode 50 is positioned on the gas distribution plate 40, and the RF electrode 50 is connected with the periphery of the gas distribution plate 40. Also, the RF electrode 50 is connected with an RF power source 55. Also, the gas supply pipe 30 penetrates a central part of the RF electrode 50, whereby the gas supply pipe 30 is positioned at the central part of the RF electrode 50. The pressure adjustment pump 60 is connected with a lower side of the chamber 10 so as to control a processing pressure inside the chamber 10. The chamber 10 is generally grounding, and both the gas distribution plate 40 and the RF electrode 50 are insulated from the chamber 10 by an additionally-provided insulation member 15.

A process for depositing the semiconductor layer 300 on the substrate (S) through the use of the aforementioned plasma CVD apparatus 11 will be described as follows.

First, the temperature of the substrate (S) is adjusted by supplying power to the electrothermal wire 25 provided in the susceptor 20; and the pressure inside the chamber 10 is adjusted through the use of pressure adjustment pump 60.

Then, the ingredient gases are supplied through the gas supply pipe 30, whereby the ingredient gases are sprayed onto the upper surface of the susceptor 20 through the gas distribution plate 40. The RF power source 55 applies RF power to the RF electrode 50, to thereby generate an RF electric field between the susceptor 20 and the gas distribution plate 40 connected with the RF electrode 50. The generated RF electric field enables the ingredient gases sprayed onto the upper surface of the susceptor 20 to be plasma corresponding to a mixture of electron and ion, whereby the semiconductor layer 300 is to be deposited on the substrate (S).

The semiconductor layer 300 with the PIN structure is formed by sequentially depositing the P-type semiconductor layer 320, the I-type semiconductor layer 340, and the N-type semiconductor layer 360 in the aforementioned plasma CVD method. Especially, the P-type semiconductor layer 320, the I-type semiconductor layer 340, and the N-type semiconductor layer 360 can be sequentially deposited in one plasma CVD apparatus 11 by changing the supplied ingredient gases and the processing conditions.

In order to decrease the number of dangling bonding sites or Si—$H_2$ bonding sites existing in the I-type semiconductor layer 340, it is necessary to satisfy the optimal processing conditions, for example, the optimal content ratio of ingredient gases, the optimal pressure inside the chamber 10, and the optimal temperature of the substrate (S).

Preferably, the content ratio of the ingredient gases is optimized in such a way that a ratio of silicon-containing gas to hydrogen-containing gas is within a range between 1:7 and 1:10. If the hydrogen-containing gas is less than 7, a degradation rate becomes more than 20%. Meanwhile, if the hydrogen-containing gas is more than 10, it is problematic in that initial cell efficiency is lowered. The silicon-containing gas may be $SiH_4$ gas, and the hydrogen-containing gas may be $H_2$ gas.

Preferably, the pressure inside the chamber 10 is within a range between 2.0 Torr and 2.4 Torr. If the pressure inside the chamber 10 is smaller than 2.0 Torr, it is problematic in that the degradation rate becomes more than 20%. If the pressure inside the chamber 10 is larger than 2.4 Torr, it has a problem related with degradation of quality because thin film is peeled-off.

Preferably, the temperature of the substrate (S) is within a range between 225° C. to 250° C. If the temperature of the substrate (S) is lower than 225° C., it is problematic in that the degradation rate becomes more than 20%. Meanwhile, if the temperature of the substrate (S) is higher than 250° C., it is problematic in that both initial cell efficiency and quality of thin film are lowered.

Under such circumstances that the at least two or all three conditions among the optimal content ratio of the ingredient gases, the optimal pressure inside the chamber 10, and the optimal temperature of the substrate (S) are satisfied, the deposition process may be carried out. If the deposition process is carried out under such circumstances that the at least two among the optimal content ratio of the ingredient gases, the optimal pressure inside the chamber, and the optimal temperature of the substrate (S) are satisfied, the degradation rate is more lowered in comparison to that of the case satisfying each of the optimal content ratio of the ingredient gases, the optimal pressure inside the chamber, and the optimal temperature of the substrate (S).

Under such circumstances that all the aforementioned conditions related with the optimal content ratio of the ingredient gases, the optimal pressure inside the chamber 10, and the optimal temperature of the substrate (S) are satisfied, if the deposition process is performed at a high rate of 200 Å/min or more, the degradation rate becomes 20% or less than 20%, and more preferably 18% or less than 18%. Even though the deposition rate is raised to 250 Å/min, the degradation rate becomes 20% or less than 20%.

According to the aforementioned method, the I-type semiconductor layer 340 of amorphous silicon is formed, and then the P-type semiconductor layer 320 and the N-type semiconductor layer 360 are formed on the I-type semiconductor layer 340. In this case, the P-type semiconductor layer 320 and the N-type semiconductor layer 360 are sequentially formed by respectively adding P-type and N-type dopant gases to the ingredient gases. In addition, the deposition process may be carried out under the aforementioned optimal processing conditions, but not necessarily.

As shown in FIG. 2(C), a transparent conductive layer 400 is formed on the N-type semiconductor layer 360.

The transparent conductive layer 400 may be formed of a transparent conductive material, for example, ZnO, ZnO:B, ZnO:Al, ZnO:H, or Ag by a sputtering or MOCVD (Metal Organic Chemical Vapor Deposition) method.

The transparent conductive layer 400 may be omitted. However, in order to improve the cell efficiency, forming the transparent conductive layer 400 is preferable to omitting the transparent conductive layer 400. This is because the transparent conductive layer 400 enables the solar ray transmitted through the semiconductor layer 300 to be dispersed in all angles, whereby the solar ray reflected on a rear electrode layer 500 to be explained is highly re-incident on the semiconductor layer 300, thereby resulting in the improved cell efficiency.

As shown in FIG. 2(D), the rear electrode layer 500 is formed on the transparent conductive layer 400, thereby completing the process for manufacturing the thin film type solar cell.

The rear electrode layer 500 may be formed of a metal material, for example, Ag, Al, Ag+Al, Ag+Mg, Ag+Mn, Ag+Sb, Ag+Zn, Ag+Mo, Ag+Ni, Ag+Cu, or Ag+Al+Zn by a screen printing method, an inkjet printing method, a gravure printing method, or a micro-contact printing method.

EXPERIMENTAL EXAMPLES

Hereinafter, various tests will be shown as follows so as to verify that the degradation rate is changed in various samples of thin film type solar cells according to the content ratio of the ingredient gases, the chamber pressure, the substrate temperature, or the deposition rate during the process for depositing the I-type semiconductor layer.

1. Variation of Degradation Rate According to Change of Content Ratio of Ingredient Gases First, a front electrode layer of ZnO is formed on a glass substrate by an MOCVD method. Then, P-type, I-type, and N-type semiconductor layers of amorphous silicon are sequentially deposited on the front electrode layer by a plasma CVD method. Thereafter, a transparent conductive layer of ZnO is formed on the N-type semiconductor layer by the MOCVD method, and a rear electrode layer of Ag is formed on the transparent conductive layer by a screen printing method, thereby manufacturing a sample of thin film type solar cell.

In this case, as shown in the following Table 1, various samples of thin film type solar cells according to comparative examples and embodiments may be manufactured by performing the process for forming the I-type semiconductor layer under such circumstances that only the content ratio of the ingredient gases is selectively changed while maintaining the predetermined chamber pressure, the predetermined substrate temperature, and the predetermined deposition rate.

TABLE 1

| Classification | Content ratio of ingredient gases ($SiH_4:H_2$) | Chamber pressure (Torr) | Substrate temperature (° C.) | Deposition rate (Å/min) |
|---|---|---|---|---|
| Comparative example 1 | 1:5 | 1.8 | 180 | 250 |
| Comparative example 2 | 1:12 | 1.8 | 180 | 250 |
| Embodiment 1 | 1:7 | 1.8 | 180 | 250 |
| Embodiment 2 | 1:9 | 1.8 | 180 | 250 |
| Embodiment 3 | 1:10 | 1.8 | 180 | 250 |

The aforementioned samples of the thin film type solar cells according to the comparative examples and embodiments are degraded in a light soaking apparatus for 24 hours, and then degradation rates of the respective samples are measured by a solar simulation apparatus. The measured degradation rates of the respective samples are shown in FIG. 4.

Figure 4:
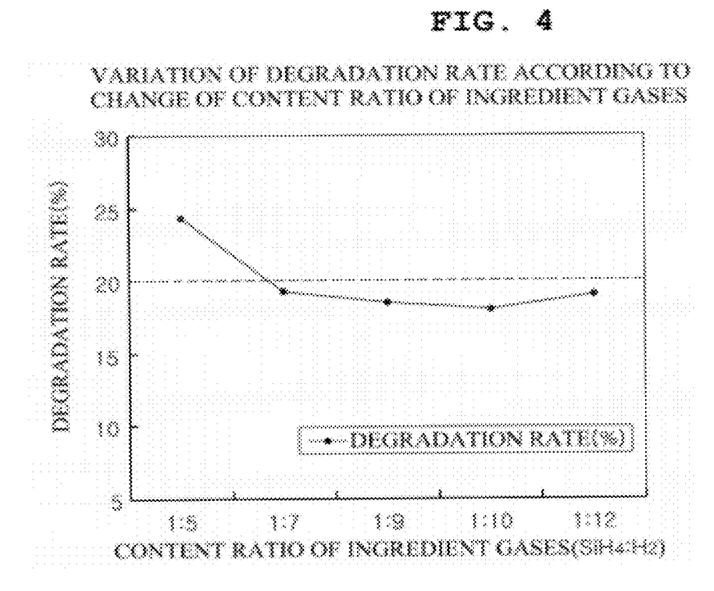
FIG. 4 is a graph illustrating a variation of degradation rate according to a content ratio of ingredient gases.

FIG. 4 is a graph illustrating the degradation rate according to the change of the content ratio of the ingredient gases. As shown in FIG. 4, the comparative example 1 shows the degradation rate above 20%. Except the comparative example 1, the comparative example 2 and the embodiments 1 to 3 show the degradation rate less than 20%. However, if the content of $H_2$ gas is more than 10, as shown in the comparative example 2, it is problematic in that initial cell efficiency is lowered. Preferably, the content ratio of $SiH_4$ gas to $H_2$ gas is maintained within a range between 1:7 and 1:10.

2. Variation of Degradation Rate According to Change of Chamber Pressure

As shown in the following Table 2, various samples of thin film type solar cells according to comparative examples and embodiments may be manufactured by performing the process for forming the I-type semiconductor layer under such circumstances that only the chamber pressure is selectively changed while maintaining the predetermined content ratio of the ingredient gases, the predetermined substrate temperature, and the predetermined deposition rate.

TABLE 2

| Classification | Content ratio of ingredient gases ($SiH_4:H_2$) | Chamber pressure (Torr) | Substrate temperature (° C.) | Deposition rate (Å/min) |
|---|---|---|---|---|
| Comparative example 3 | 1:5 | 1.8 | 180 | 250 |
| Comparative example 4 | 1:5 | 2.6 | 180 | 250 |
| Embodiment 4 | 1:5 | 2.0 | 180 | 250 |
| Embodiment 5 | 1:5 | 2.2 | 180 | 250 |
| Embodiment 6 | 1:5 | 2.4 | 180 | 250 |

The aforementioned samples of the thin film type solar cells according to the comparative examples and embodiments are degraded in a light soaking apparatus for 24 hours, and then degradation rates of the respective samples are measured by a solar simulation apparatus. The measured degradation rates of the respective samples are shown in FIG. 5.

Figure 5:
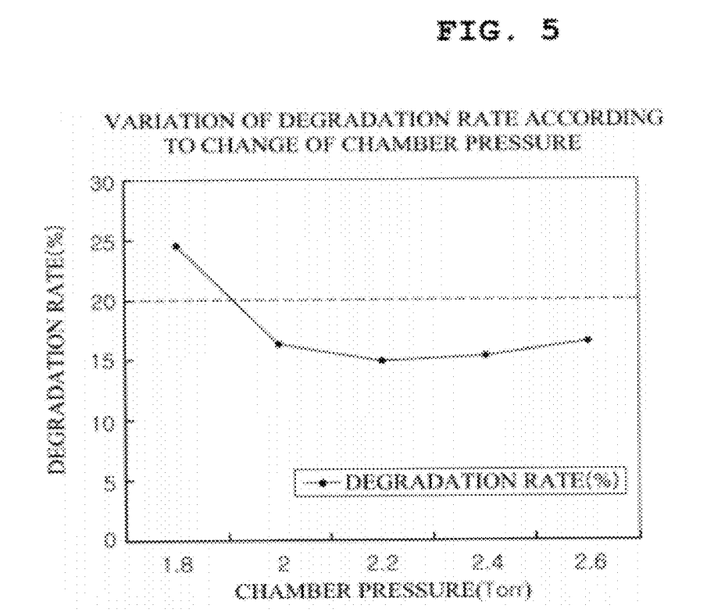
FIG. 5 is a graph illustrating a variation of degradation rate according to a chamber pressure.

FIG. 5 is a graph illustrating the degradation rate according to the change of the chamber pressure. As shown in FIG. 5, the comparative example 3 shows the degradation rate above 20%. Except the comparative example 3, the comparative example 4 and the embodiments 4 to 6 show the degradation rate less than 20%. However, when the chamber pressure is larger than 2.4 Torr, as shown in the comparative example 4, it has a problem related with degradation of quality because thin film is peeled-off. Thus, in order to maintain the degradation rate less than 20%, it is preferable that the chamber pressure be within a range between 2.0 Torr and 2.4 Torr.

3. Variation of Degradation Rate According to Change of Substrate Temperature

As shown in the following Table 3, various samples of thin film type solar cells according to comparative examples and embodiments may be manufactured by performing the process for forming the I-type semiconductor layer under such circumstances that only the substrate temperature is selectively changed while maintaining the predetermined content ratio of the ingredient gases, the predetermined chamber pressure, and the predetermined deposition rate.

TABLE 3

| Classification | Content ratio of ingredient gases ($SiH_4:H_2$) | Chamber pressure (Torr) | Substrate temperature (° C.) | Deposition rate (Å/min) |
|---|---|---|---|---|
| Comparative example 5 | 1:5 | 1.8 | 180 | 250 |
| Comparative example 6 | 1:5 | 1.8 | 200 | 250 |
| Comparative example 7 | 1:5 | 1.8 | 210 | 250 |
| Comparative example 8 | 1:5 | 1.8 | 220 | 250 |
| Comparative example 9 | 1:5 | 1.8 | 260 | 250 |
| Embodiment 7 | 1:5 | 1.8 | 230 | 250 |
| Embodiment 8 | 1:5 | 1.8 | 240 | 250 |
| Embodiment 9 | 1:5 | 1.8 | 250 | 250 |

The aforementioned samples of the thin film type solar cells according to the comparative examples and embodiments are degraded in a light soaking apparatus for 24 hours, and then degradation rates of the respective samples are measured by a solar simulation apparatus. The measured degradation rates of the respective samples are shown in FIG. 6.

Figure 6:
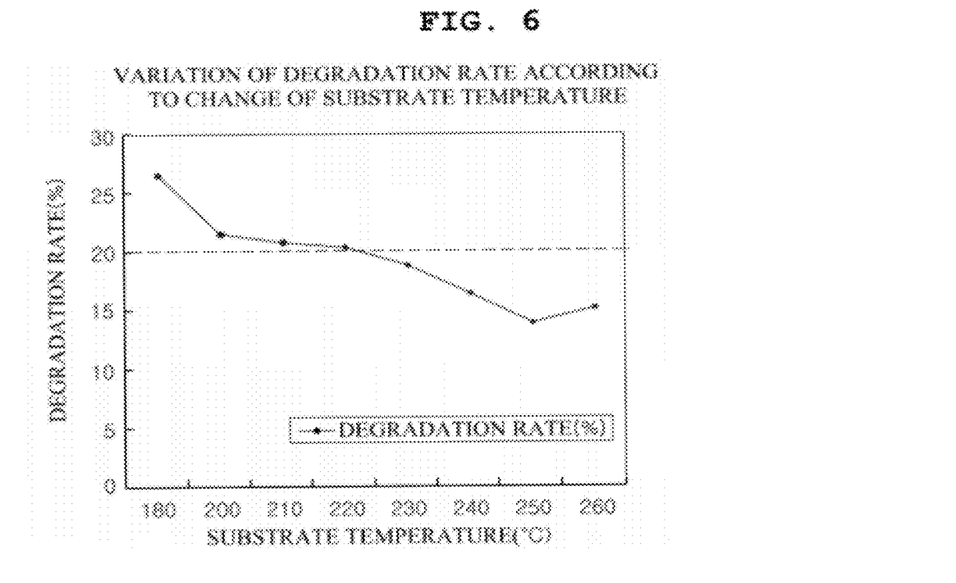
FIG. 6 is a graph illustrating a variation of degradation rate according to a substrate temperature.

FIG. 6 is a graph illustrating the degradation rate according to the change of the substrate temperature. As shown in FIG. 6, the comparative examples 5 to 8 show the degradation rate above 20%. Except the comparative examples 5 to 8, the comparative example 9 and the embodiments 7 to 9 show the degradation rate less than 20%. However, when the substrate temperature is higher than 250° C., as shown in the comparative example 9, it is problematic in that both initial cell efficiency and quality of thin film are lowered. Thus, in order to maintain the degradation rate less than 20%, it is preferable that the substrate temperature be within a range between 225° C. and 250° C.

4. Variation of Degradation Rate According to Changes of Chamber Pressure and Substrate Temperature As shown in the following Table 4, various samples of thin film type solar cells according to comparative examples and embodiments may be manufactured by performing the process for forming the I-type semiconductor layer under such circumstances that the chamber pressure and the substrate temperature are selectively set while maintaining the predetermined content ratio of the ingredient gases, and the predetermined deposition rate.

TABLE 4

| Classification | Content ratio of the ingredient gases ($SiH_4:H_2$) | Chamber pressure (Torr) | Substrate temperature (° C.) | Deposition rate (Å/min) |
| --- | --- | --- | --- | --- |
| Embodiment 10 | 1:5 | 2.2 | 180 | 250 |
| Embodiment 11 | 1:5 | 2.2 | 230 | 250 |

The aforementioned samples of the thin film type solar cells according to the comparative examples and embodiments are degraded in a light soaking apparatus for 24 hours, and then degradation rates of the respective samples are measured by a solar simulation apparatus. The measured degradation rates of the respective samples are shown in FIG. 7.

Figure 7:
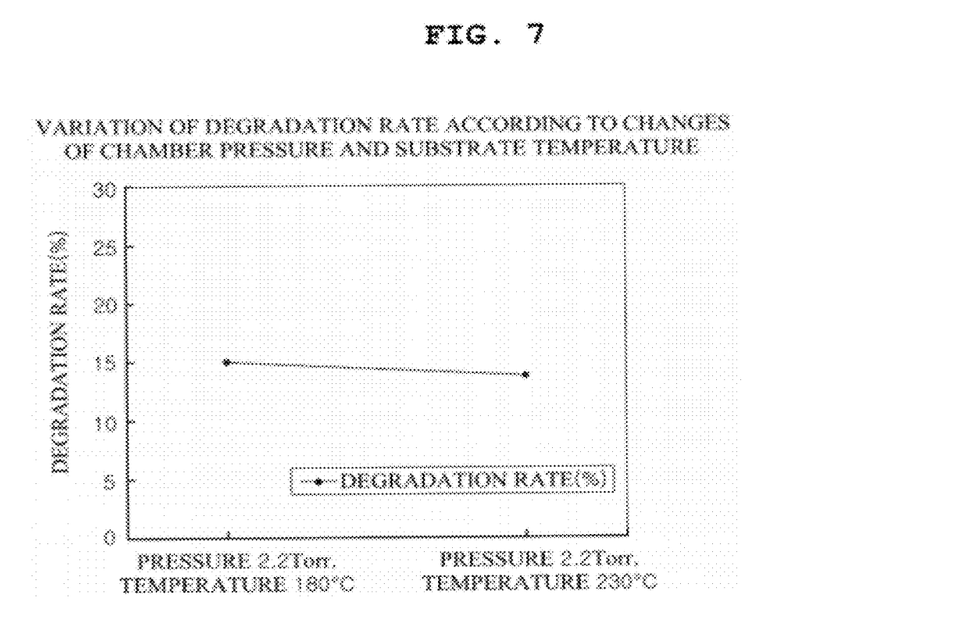
FIG. 7 is a graph illustrating variations of degradation rate when only chamber pressure is optimized, and when both chamber pressure and substrate temperature are optimized.

FIG. 7 is a graph illustrating the change of the degradation rate when only the chamber pressure is optimized (See the embodiment 10), and when both the chamber pressure and the substrate temperature are optimized (See the embodiment 11). As shown in FIG. 7, the embodiment 10 shows that the degradation rate is about 15%, and the embodiment 11 shows that the degradation rate is about 14%, wherein the degradation rate of the embodiment 11 is lower than the degradation rate of the embodiment 10. For reducing the degradation rate, it is preferable that the at least two of the aforementioned conditions be satisfied.

5. Variation of Degradation Rate According to Change of Deposition Rate

As shown in the following Table 5, various samples of thin film type solar cells according to comparative examples and embodiments may be manufactured by performing the process for forming the I-type semiconductor layer under such circumstances that the deposition rate and the substrate temperature are selectively set while maintaining the predetermined content ratio of the ingredient gases, and the predetermined chamber pressure.

TABLE 5

| Classification | Content ratio of ingredient gases ($SiH_4:H_2$) | Chamber pressure (Torr) | Substrate temperature (° C.) | Deposition rate (Å/min) |
| --- | --- | --- | --- | --- |
| Comparative example 10 | 1:5 | 1.8 | 180 | 120 |
| Comparative example 11 | 1:5 | 1.8 | 180 | 210 |
| Comparative example 12 | 1:5 | 1.8 | 180 | 250 |
| Embodiment 12 | 1:5 | 1.8 | 230 | 120 |
| Embodiment 13 | 1:5 | 1.8 | 230 | 210 |
| Embodiment 14 | 1:5 | 1.8 | 230 | 250 |

The aforementioned samples of the thin film type solar cells according to the comparative examples and embodiments are degraded in a light soaking apparatus for 24 hours, and then degradation rates of the respective samples are measured by a solar simulation apparatus. The measured degradation rates of the respective samples are shown in FIGS. 8(A and B).

Figure 8A:
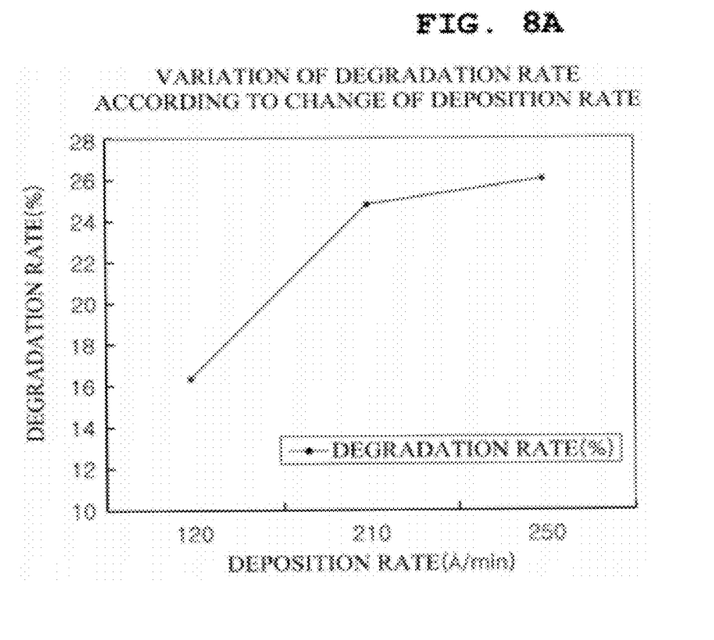
Figure 8B:
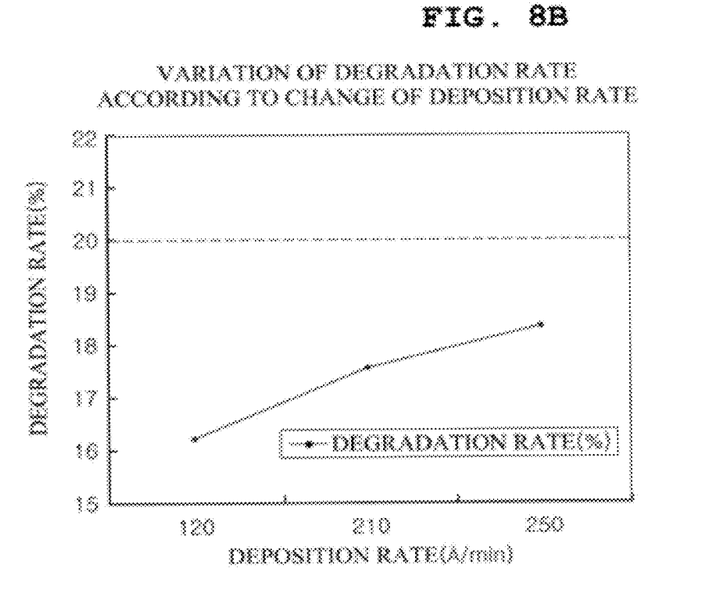

FIG. 8(A) is a graph illustrating the variation of the degradation rate in the comparative examples 10 to 12. As shown in FIG. 8(A), when the deposition rate is gradually raised in the comparative examples 10 to 12, the degradation rate is rapidly increased. When the deposition rate is at 250 Å/min, the degradation rate is highly increased to about 26%.

FIG. 8(B) is a graph illustrating the variation of the degradation rate in the embodiments 12 to 14. As shown in FIG. 8(B), when the deposition rate is gradually raised in the embodiments 12 to 14, the degradation rate is gently increased. Even in case the deposition rate is at 250 Å/min, the degradation rate is maintained to be less than about 19%.

Accordingly, the method for manufacturing the thin film type solar cell according to the present invention has the following advantages.

During the process for depositing the I-type semiconductor layer 340 of the amorphous silicon included in the semiconductor layer 300 with the PIN structure by the plasma CVD method, it is possible to decrease the number of dangling bonding sites or $Si-H_2$ bonding sites existing in the amorphous silicon by satisfying the processing condition related with the content ratio of the ingredient gases, the chamber pressure, or the substrate temperature, to thereby reduce the degradation of solar cell.

Under such circumstances that the aforementioned conditions related with the optimal content ratio of the ingredient gases, the optimal chamber pressure, and the optimal substrate temperature are satisfied, the degradation rate is maintained to be less than 20%, and more preferably less than 18%, even though the deposition rate is at 250 Å/min. Accordingly, the yield can be improved owing to the decrease of tack time.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a thin film type solar cell comprising:
   forming a front electrode layer on a substrate;
   sequentially depositing P-type, I-type, and N-type semiconductor layers on the front electrode layer; and
   forming a rear electrode layer on the N-type semiconductor layer,
   wherein the process for forming the I-type semiconductor layer comprises forming an amorphous silicon layer by a plasma CVD method under such circumstances that a chamber pressure is maintained at a range between 2.0 Torr and 2.4 Torr, and a substrate temperature is maintained at a range between 225° C. and 250° C., and a content ratio of silicon-containing gas to hydrogen-containing gas is within a range between 1:7 and 1:10,
   wherein the process for forming the I-type semiconductor layer comprises forming an amorphous silicon layer at a deposition rate of 200 Å/min to 250 Å/min.

2. The method of claim 1, further comprising forming a transparent conductive layer on the N-type semiconductor layer before the process for forming the rear electrode layer.

3. The method of claim 1, wherein RF power is applied for forming the amorphous silicon layer by the plasma CVD method.

* * * * *